United States Patent [19]

Holden

[11] Patent Number: 4,542,298

[45] Date of Patent: Sep. 17, 1985

[54] METHODS AND APPARATUS FOR GAS-ASSISTED THERMAL TRANSFER WITH A SEMICONDUCTOR WAFER

[75] Inventor: Scott C. Holden, Manchester, Mass.

[73] Assignee: Varian Associates, Inc., Palo Alto, Calif.

[21] Appl. No.: 502,812

[22] Filed: Jun. 9, 1983

[51] Int. Cl.$^4$ .............................................. G01N 21/00
[52] U.S. Cl. .............................. 250/443.1; 250/440.1
[58] Field of Search .................. 165/80 C, 80 E, 185; 148/1.5; 250/440.1, 443.1

[56] References Cited

U.S. PATENT DOCUMENTS

| | | | |
|---|---|---|---|
| 3,062,507 | 11/1962 | Andrus | 257/212 |
| 3,566,960 | 8/1969 | Stuart | 165/107 |
| 4,264,762 | 4/1981 | King | 148/1.5 |
| 4,282,924 | 8/1981 | Faretra | 165/80 E |

OTHER PUBLICATIONS

King et al., "Experiments on Gas Cooling of Wafers," *Nucl. Instrum. Methods,* 189, (1981), pp. 169–173.

Hammer, "Cooling Ion Implantation Target," *IBM Technical Disclosure Bulletin,* vol. 19, No. 6, Nov. 1976.

*Primary Examiner*—Bruce C. Anderson
*Attorney, Agent, or Firm*—Stanley Z. Cole; William R. McClellan

[57] ABSTRACT

Methods and apparatus for differential pumping of a thermal transfer gas used to transfer thermal energy between a semiconductor wafer and a platen during processing in a vacuum chamber. Housing structure defines an intermediate region adjacent to and surrounding the platen. The gas, which is introduced into a thermal transfer region behind the wafer, is restricted from flowing into the intermediate region by intimate contact between the wafer and the platen. A clamping ring, which clamps the wafer to the platen, and a bellows coupled between the clamping ring and the housing restrict flow of gas from the intermediate region to the vacuum chamber. The intermediate region is vacuum pumped to a pressure lower than the pressure in the thermal transfer region whereby leakage of the gas into the vacuum chamber is reduced.

14 Claims, 2 Drawing Figures

METHODS AND APPARATUS FOR GAS-ASSISTED THERMAL TRANSFER WITH A SEMICONDUCTOR WAFER

BACKGROUND OF THE INVENTION

This invention relates to processing of semiconductor wafers in a vacuum chamber and, more particularly, to methods and apparatus for gas-assisted thermal transfer utilizing differential vacuum pumping to reduce gas leakage into the vacuum chamber.

In the fabrication of integrated circuits, a number of processes have been established which involve the application of high energy beams onto semiconductor wafers in vacuum. These processes include ion implantation, ion beam milling and reactive ion etching. In each instance, a beam of ions is generated in a source and directed with varying degrees of acceleration toward a target. Ion implantation has become a standard technique for introducing impurities into semiconductor wafers. Impurities are introduced into the bulk of semiconductor wafers by using the momentum of energetic ions as a means of imbedding them in the crystalline lattice of the semiconductor material.

As energetic ions impinge on a semiconductor wafer and travel into the bulk, heat is generated by the atomic collisions. This heat can become significant as the energy level or current level of the ion beam is increased and can result in uncontrolled diffusion of impurities beyond prescribed limits. A more severe problem with heating is the degradation of patterned photoresist layers which are applied to semiconductor wafers before processing and which have relatively low melting points.

In commercial semiconductor processing, a major objective is to achieve a high throughput in terms of wafers processed per unit time. One way to achieve high throughput in an ion beam system is to use a relatively high power beam. Large amounts of heat may be generated. Thus, it is necessary to provide cooling of the wafer in order to prevent elevated temperatures from being attained.

Techniques for keeping the wafer temperature below a prescribed limit have included batch processing in which the incident power is spread over a large area, time-shared scanning of the beam, and conductive cooling through direct solid-to-solid contact between a wafer and a heat sink (pending application Ser. No. 284,915, filed July 20, 1981; and U.S. Pat. No. 4,282,924, issued Aug. 11, 1981, to Faretra). The cooling efficiency of systems employing solid-to-solid contact is limited by the extent to which the backside of the wafer contacts the thermally conductive surface, since, at the microscopic level, only small areas of the two surfaces (typically less than 5%) actually come into contact.

The technique of gas conduction is known to permit thermal coupling between two opposed surfaces and has been widely employed. In U.S. Pat. No. 3,566,960, "Cooling Apparatus For Vacuum Chamber," Stewart, the problem of inadequate contact between solid surfaces is discussed; and a circulating gaseous or liquid medium to cool the workpiece in the vacuum chamber is disclosed. In the same vein, gas conduction cooling of a workpiece, preferably a semiconductor wafer in a vacuum, is shown in King et al, "Experiments on Gas Cooling of Wafers," Proc. 3rd Inter. Conf. on Ion Implantation Equipment and Techniques, Queens University, Kingston, Ontario, May 1980, and in U.S. Pat. No. 4,264,762, "Method Of Conducting Heat To Or From An Article Being Treated Under Vacuum," King. In this apparatus, gas is introduced into the middle of a cavity behind a semiconductor wafer. Thermal coupling between a support plate and the wafer is achieved through a gas as typically accomplished in the gas conduction art.

Gas-assisted, solid-to-solid thermal transfer with semiconductor wafer is disclosed in pending application Ser. No. 381,669, filed May 25, 1982, and assigned to the assignee of the present application. A semiconductor wafer is clamped at its periphery onto a shaped platen. Gas under pressure is introduced into the microscopic void region between the platen and the wafer. The gas presssure approaches that of the preloading clamping pressure without any appreciable increase in the wafer-to-platen spacing. Since the gas pressure is significantly increased without any increase in the wafer-to-platen gap, the thermal resistance is reduced, and solid-to-solid thermal transfer with gas assistance produces optimum results.

When gas is utilized to transfer heat between a wafer and a heat sink during vacuum processing, it is necessary to confine the gas to the region behind the wafer and to prevent escape of the gas into the vacuum chamber. Gas escaping into the vacuum chamber is likely to have deleterious effects on the process being performed. For example, ion implantation requires pressures on the order of $10^{-6}$ Torr in order to implant highly accurate, highly uniform impurity doses. When the pressure in the vacuum chamber increases due to gas leakage, the ion beam experiences neutralizing collisions with gas molecules. As a result, the dose measurement accuracy, which relies upon charge measurement, is reduced.

Typically, elastomer O-rings have been utilized to isolate the region containing the thermal transfer gas from the vacuum chamber. In U.S. Pat. No. 4,264,762 and in pending application Ser. No. 381,669, an O-ring is positioned between the backside of the wafer and the platen near the wafer periphery. While this arrangement provides generally satisfactory sealing, it has certain drawbacks. Due to the elevated temperatures, the wafer can stick to the O-ring, thereby causing an interruption in processing. Furthermore, the O-ring must be located substantially inward of the wafer edge to avoid the wafer flat used for crystal orientation. Therefore, the outer edge portion of the wafer is not cooled. If the wafer is clamped outside the O-ring radius, undesired stresses are applied to the wafer. W. N. Hammer in "Cooling Ion Implantation Target," *IBM Technical Disclosure Bulletin,* Vol. 19, No. 6, November 1976, discloses apparatus in which gas flows through a chamber behind the wafer. The gas-filled chamber is sealed from the vacuum chamber by an O-ring around the periphery of the front surface of the wafer. The potential for sticking of the front surface of the wafer to the O-ring is even more severe, since photoresist is usually applied to the front surface of the wafer. Furthermore, there exists the possibility of wafer contamination by the material of the O-ring. As described above, the O-ring must be located inwardly of the outer edge of the wafer due to the wafer flat. It is, therefore, desirable to provide a system in which gas leakage between the backside of the wafer and the vacuum chamber is minimized and in which the problems described above are alleviated.

It is a general object of the present invention to provide novel methods and apparatus for gas-assisted thermal transfer with a semiconductor wafer.

It is another object of the present invention to provide methods and apparatus for reducing the leakage into a vacuum processing chamber of a thermal transfer gas introduced behind a semiconductor wafer.

It is yet another object of the present invention to provide methods and apparatus for differential pumping of a thermal transfer gas during vacuum processing of a semiconductor wafer.

It is still another object of the present invention to provide methods and apparatus for gas-assisted thermal transfer with a semiconductor wafer, wherein elastomer sealing materials are not required to be in contact with the wafer.

SUMMARY OF THE INVENTION

According to the present invention, these and other objects and advantages are achieved in apparatus for gas-assisted thermal transfer with a semiconductor wafer during processing in a vacuum chamber. The apparatus comprises structure defining an intermediate region adjacent the wafer and isolated from the external environment and platen means including means for supporting the wafer in a processing position with its front surface exposed to the vacuum chamber. The platen means further includes means for introduction of a gas at a prescribed pressure into a thermal transfer region between the rear surface of the wafer and the platen means and first restriction means operative to restrict the flow of gas between the thermal transfer region and the intermediate region. The apparatus further comprises second restriction means for restricting the flow of gas between the intermediate region and the vacuum chamber and vacuum pumping means coupled to the intermediate region and operative to maintain the intermediate region at a pressure below the prescribed pressure of the gas in the thermal transfer region during processing. Leakage of the gas into the vacuum chamber is thereby reduced.

According to another aspect of the present invention, there is provided a method for gas-assisted thermal transfer with a semiconductor wafer during processing in a vacuum chamber. The method comprises positioning the wafer on a platen in a processing position with the front surface of the wafer exposed to the vacuum chamber and introducing a gas at a prescribed pressure into a thermal transfer region between the rear surface of the wafer and the platen. Structure defining an intermediate region is provided adjacent the wafer and isolated from the external environment. The flow of gas between the thermal transfer region and the intermediate region is restricted, and the flow of gas between the intermediate region and the vacuum chamber is restricted. The intermediate region is vacuum pumped so as to maintain the pressure therein below the prescribed pressure of the gas in the thermal transfer region and thereby reduce leakage of the gas into the vacuum chamber.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
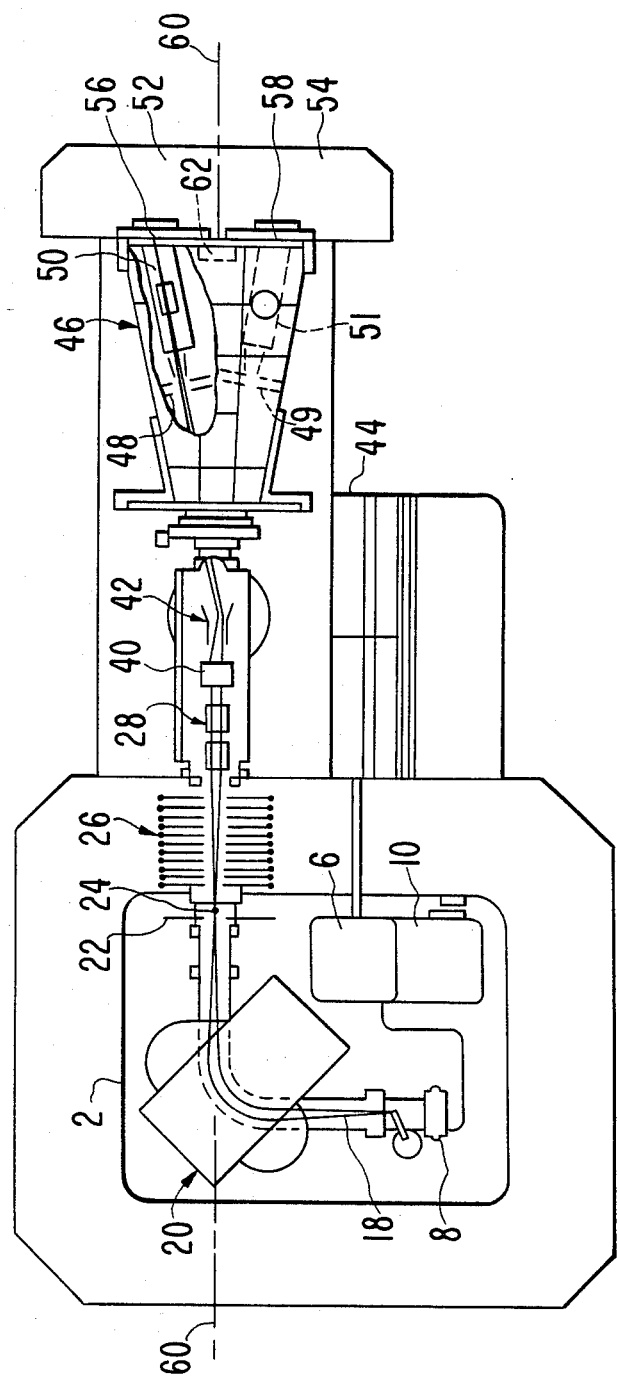
FIG. 1 is a schematic diagram viewed from above of an ion implantation system incorporating the present invention.

An ion implantation system suitable for incorporation of the apparatus of the present invention is illustrated in FIG. 1. A high voltage terminal 2 is held at high potential relative to ground by a high voltage power supply (not shown). The terminal 2 houses the apparatus required to form a beam of ions of desired species. In common practice, a gaseous feedstock of the desired species is employed. A source gas produced from a gas handling system 6 is directed to an ion source 8 which is powered by a power supply 10 and provides a high current ion beam 18. Ion source techniques are generally known in the art. The ion beam 18 diverging from the ion source 8 is mass analyzed and focused by an analyzer magnet 20. The analyzed beam passes through a resolving aperture 22 and a variable slit 24 and then through an acceleration tube 26 where it encounters a carefully designed field gradient from the high voltage terminal 2 to ground potential. Optical elements such as quadrupole lens 28 operate to produce a spatial energy focus at a target plane. Y deflection plates 40 and X deflection plates 42 provide electrostatic deflection which directs the beam 18 over the area of the target plane. The waveforms applied to the respective deflection plates, to form the desired scanning pattern, are provided by a scanning system 44.

A dual target chamber 46 includes a housing, beam defining masks 48, 49 and Faraday cages 50, 51 for beam monitoring. Automatic wafer transfer systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. The target positions 56, 58 are typically located within air locks and are displaced horizontally on opposite sides of the longitudinal axis 60 of the undeflected beam 18, such as to require a beam deflection of about ±7° from the longitudinal axis for scanning thereof. A beam dump 62 is located on the longitudinal axis 60 in the target chamber 46 and intercepts the neutral portion of the ion beam 18.

Figure 2:
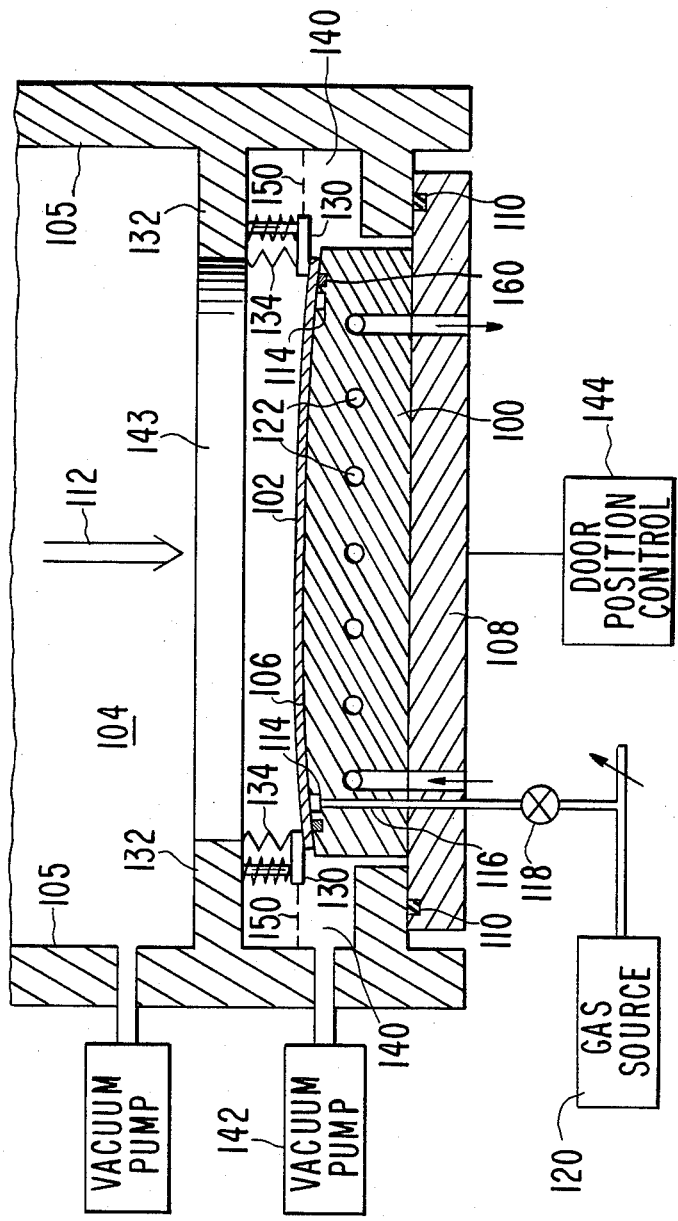
FIG. 2 is a cross-sectional view of apparatus for gas-assisted thermal transfer with a semiconductor wafer in accordance with the present invention.

Referring now to FIG. 2, there is shown apparatus for gas-assisted thermal transfer with a semiconductor wafer in accordance with the present invention. The apparatus can be utilized in the ion implantation system of FIG. 1. The target region of the ion implantation system is illustrated in simplified cross-sectional view. A platen 100 provides support for a semiconductor wafer 102 in a processing position with its front surface exposed to a vacuum chamber 104. The position of the wafer 102 corresponds to the target positions 56, 58 shown in FIG. 1; and the vacuum chamber 104 corresponds to the vacuum chamber 46 shown in FIG. 1. The platen 100 is typically a metal, such as aluminum, and can include a curved surface 106, as described in U.S. Pat. No. 4,282,924 and pending application Ser. No. 381,668, filed May 25, 1982, and assigned to the assignee of the present invention. When the wafer 102 is clamped against the surface 106, it is deflected to conform to the surface 106. The contour of the surface 106 is selected to insure intimate contact between the wafer 102 and the surface 106. The platen 100 can be attached to, or can be part of, a chamber door 108. An O-ring 110 on the chamber door 108 seals the platen 100 into the vacuum chamber 104.

During processing, an ion beam 112 impinges on the wafer 102 and generates heat therein. The wafer 102 is in contact with the curved surface 106 in order to remove the heat by conduction. However, as noted above, the back surface of the wafer 102 and the surface 106 actually make contact over less than 5% of the total area due to microscopic surface irregularities. Numerous microscopic voids exist between the actual points of contact. When these voids are evacuated, heat conduction is greatly reduced. To alleviate this problem, a gas, such as air, at a prescribed pressure is introduced into the microscopic voids by means of an annular groove 114 in the surface 106 coupled to a passage 116. The passage 116 is coupled through a shutoff valve 118 to a gas source 120 at the prescribed pressure, which is typically in the range between one Torr and fifty Torr. The gas-filled microscopic voids comprise a thermal transfer region which conducts heat between the wafer 102 and the platen 100. Further details on the technique of gas-assisted thermal transfer are disclosed in pending application Ser. No. 381,669. The platen 100 can be provided with passages 122 for circulation of a coolant such as water.

A spring-loaded clamping ring 130 is attached to a flange 132 which is part of the housing 105. When the platen 100 is in the processing position, the clamping ring 130 securely clamps the wafer 102 against the surface 106. A cylindrical bellows 134 is coupled between the flange 132 and the clamping ring 130 and functions as described hereinafter.

Housing structure adjacent to the platen 100 and the wafer 102 defines an intermediate region 140 surrounding the platen 100 and the wafer 102. The structure defining the region 140 can be an integral part of the housing 105 or it can be a separate structural member attached to the housing 105. The intermediate region 140 is isolated from the external environment by the O-ring 110 and is isolated from the vacuum chamber 104 by the clamping ring 130 and the bellows 134. While the contact between the clamping ring 130 and the wafer 102 does not provide a high quality vacuum seal, the arrangement restricts the flow of gas between the intermediate region 140 and the vacuum chamber 104. Furthermore, the clamping ring 130 presses the wafer 102 against the surface 106, thereby creating a restriction to the flow of gas between the thermal transfer region behind the wafer 102 and the intermediate region 140. The intermediate region 140 is coupled to a vacuum pump 142.

Typically, the vacuum chamber 104 and the platen 100 are separated by a vacuum gate valve 143, thereby creating an air lock which permits wafers to be exchanged without venting the vacuum chamber 104. The chamber door 108 and the platen 100 are coupled to a position control means 144 which is operative to open the door 108 from the wafer processing position, as shown in FIG. 2, to a wafer transfer position in which wafers are exchanged. The control means 144 can, for example, be an air cylinder.

In operation, the door 108 is opened and a wafer is placed on the surface 106 of the platen 100 and can be retained thereon by a vacuum chuck (not shown) until the door 108 is closed. When the door 108 is closed, the clamping ring 130 bears against the wafer 102 around its outer periphery and securely clamps the wafer against the platen 100. After the door 108 is sealed, the air lock defined by the vacuum gate valve 143 is vacuum pumped to the approximate pressure of the vacuum chamber 104; and the gate valve 143 is opened. The valve 118 is opened, thereby permitting introduction of gas at the prescribed pressure in the thermal transfer region between the wafer 102 and the platen 100. Ion implantation of the wafer 102 now proceeds by scanning of the ion beam 112 over the surface of the wafer. Heat imparted to the wafer 102 by the ion beam 112 is transferred to the platen 100 by the gas in the thermal transfer region and by direct conduction at the points of physical contact is then removed from the platen 100 by the coolant circulating through the passages 122.

The clamping ring 130 clamps the wafer 102 against the surface 106, thereby restricting the flow of the thermal transfer gas from the thermal transfer region into the intermediate region 140. However, as noted above, contact between the wafer 102 and the surface 106 is not complete; and microscopic voids exist. Therefore, gas is able to escape from the thermal transfer region into the intermediate region 140 but at a relatively low conductance level. The vacuum pump 142 can maintain the pressure in the intermediate region 140 substantially below the pressure in the thermal transfer region. Furthermore, the clamping ring 130 and the bellows 134 constitute a restriction to flow of gas between the intermediate region 140 and the vacuum chamber 104. The seal around the outer periphery of the wafer 102 creates a region low conductance between the intermediate region 140 and the vacuum chamber 104. Since the intermediate region 140 is maintained at a pressure substantially lower than the pressure of the gas in the thermal transfer region, the flow rate of gas into the vacuum chamber 104 is substantially reduced in comparison with prior art systems. Preferably, the pressure in the intermediate region 140 is less than one-tenth the pressure of the gas in the thermal transfer region behind the wafer 102. In practice, the pressure in the intermediate region 140 can be in the range between $1 \times 10^{-3}$ Torr and 0.2 Torr. Thus, there is provided an efficient differential pumping arrangement to insure that the gas used for thermal transfer between the wafer 102 and the platen 100 does not escape in substantial quantity into the vacuum chamber 104.

According to the present invention, the intermediate region 140 provides differential pumping of the thermal transfer gas. The intermediate region 140 is isolated from the thermal transfer region by a first restriction means and is isolated from the vacuum chamber 104 by a second restriction means. The first and second restriction means can have various forms within the scope of the present invention. For example, in FIG. 2, the bellows 134 can be replaced by a flexible membrane 150, as indicated by dashed lines in FIG. 2 extending radially outward from the clamping ring 130 to the housing 105. Alternatively, the wafer 102 can be clamped directly against the flange 132 to restrict the flow of gas from the intermediate region 140 to the vacuum chamber 104. In this case, the chamber door 108 should have spring loading or other flexible means for clamping the wafer to compensate for mechanical tolerances. For example, the platen 100 can be hydraulically actuated, as described co-pending application Ser. No. 324,512, filed Nov. 24, 1981, and assigned to the assignee of the present invention. The platen can also have other configurations. For example, in place of the curved surface 106, a cavity can be provided behind the wafer 102 for introduction of gas, as disclosed in U.S. Pat. No. 4,264,762. The gas is restricted from flowing into the intermediate region 140 by a raised annular portion of the platen around the outer periphery of the wafer or by an O-ring. Such a configuration is less preferred, since the maximum allowable gas pressure is lower than in the configuration in FIG. 2. Likewise, the gas can be introduced in the center of the wafer or at any other convenient location. The annular groove shown in FIG. 2 improves the uniformity of gas pressure behind the wafer. In the embodiment of FIG. 2, the clamping ring 130 can be dimensioned to clamp the wafer 102 very close to its outer edge, since no O-ring is used for sealing the wafer. Furthermore, the clamping ring 130 can have a flat portion to correspond to the wafer flat, thereby insuring clamping at the outermost periphery of the wafer 102. In yet another embodiment, an optical elastomer O-ring 160 can be provided in the platen 100 radially outward of the annular groove 114 for more complete sealing between the thermal transfer region and the intermediate region 140. While the O-ring has certain drawbacks, as described hereinabove, its use may be desirable in certain situations, for example, when the vacuum chamber 104 utilizes ultrahigh vacuum and leakage must be minimized.

The present invention has been described with reference to cooling of the semiconductor wafer or other workpieces. In some applications, heating of the workpiece utilizing a thermal transfer gas may be required. The present invention is equally applicable to such situations.

While there has been shown and described what is at present considered the preferred embodiments of the invention, it will be obvious to those skilled in the art that various changes and modifications may be made therein without departing from the scope of the invention as defined by the appended claims.

I claim:

1. Apparatus for gas-assisted thermal transfer with a semicondutor wafer during processing in a vacuum chamber comprising:
    structure defining an intermediate region adjacent said wafer and isolated from the external environment;
    platen means including means for supporting said wafer in a processing position with its front surface exposed to said vacuum chamber, means for introduction of a gas at a prescribed pressure into a thermal transfer region between the rear surface of said wafer and said platen means, and first restriction means operative to restrict the flow of gas between said thermal transfer region and said intermediate region;
    second restriction means for restricting the flow of gas between said intermediate region and said vacuum chamber; and
    vacuum pumping means coupled to said intermediate region and operative to maintain the pressure therein below said prescribed pressure of the gas in said thermal transfer region.

2. The apparatus as defined in claim 1 wherein said platen means includes a curved surface adapted for providing intimate contact between said wafer and said surface and wherein said thermal transfer region comprises microscopic voids between said wafer and said surface.

3. The apparatus as defined in claim 1 wherein said means for introduction of a gas includes an annular groove in said curved surface and a passage in said platen means adapted for coupling said groove to a source of gas.

4. The apparatus as defined in claim 3 wherein said platen means includes means for active cooling thereof.

5. The apparatus as defined in claim 4 wherein said means for active cooling includes a passage adapted for circulation of a cooled fluid therethrough.

6. The apparatus as defined in claim 3 wherein said first restriction means comprises a portion of said wafer support means radially outward of said annular groove, said support means portion contacting said wafer so as to restrict the flow of gas into said intermediate region.

7. The apparatus as defined in claim 3 wherein said first restriction means comprises an elastomer ring positioned radially outward of said annular groove between said wafer and said platen means so as to restrict flow of gas into said intermediate region.

8. The apparatus as defined in claim 1 wherein said second restriction means includes a movable clamping ring operative to contact said wafer around the periphery of the front surface thereof and a flexible member coupled between said clamping ring and said structure.

9. The apparatus as defined in claim 8 wherein said flexible member comprises a bellows.

10. The apparatus as defined in claim 9 wherein the pressure in said intermediate region is maintained by said vacuum pumping means less than one-tenth of said prescribed pressure.

11. A method for gas-assisted thermal transfer with a semicondutor wafer during processing in a vacuum chamber comprising:
    positioning said wafer on a platen in a processing position with the front surface of the wafer exposed to said vacuum chamber;
    introducing a gas at a prescribed pressure into a thermal transfer region between the rear surface of said wafer and said platen;
    providing structure defining an intermediate region adjacent said wafer and isolated from the external environment;
    restricting the flow of gas between said thermal transfer region and said intermediate region;
    restricting the flow of gas between said intermediate region and said vacuum chamber; and
    vacuum pumping said intermediate region so as to maintain the pressure therein below said prescribed pressure during processing.

12. The method as described in claim 11 further including the step of actively cooling said platen by circulating a coolant therethrough.

13. The method as described in claim 12 wherein said step of restricting the flow of gas between said intermediate region and said vacuum chamber includes providing a clamping ring around the periphery of the front surface of said wafer.

14. Apparatus for gas-assisted thermal transfer with a semicondutor wafer during processing in a vacuum chamber comprising:
    a platen for supporting said wafer in a processing position with its front surface exposed to said vacuum chamber, said platen including a curved surface adapted for providing intimate contact with said wafer and means for introduction of a thermal transfer gas at a prescribed pressure into the microscopic voids between said wafer and said platen;

clamping means adapted for contacting said wafer around the periphery of its front surface and clamping said wafer against said curved surface;

a housing which, in combination with said clamping means defines an intermediate region adjacent said platen and isolated from the external environment, said thermal transfer gas being restricted from flowing into said intermediate region by the intimate contact between said wafer and said curved surface and being restricted from flowing from said intermediate region into said vacuum chamber by said clamping means; and vacuum pumping means coupled to said intermediate region and operative to maintain the pressure therein below said prescribed pressure of said thermal transfer gas, whereby differential pumping of said thermal transfer gas is provided.

* * * * *